(12) United States Patent
Booth, Jr. et al.

(10) Patent No.: US 9,059,213 B2
(45) Date of Patent: Jun. 16, 2015

(54) EMBEDDED DRAM FOR EXTREMELY THIN SEMICONDUCTOR-ON-INSULATOR

(71) Applicant: International Business Machines Corporation, Armonk, NY (US)

(72) Inventors: Roger A. Booth, Jr., Wappingers Falls, NY (US); Kangguo Cheng, Schenectady, NY (US); Joseph Ervin, Hopewell Junction, NY (US); Ali Khakifirooz, Slingerlands, NY (US); Chengwen Pei, Danbury, CT (US); Ravi M. Todi, San Diego, CA (US); Geng Wang, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/845,506

(22) Filed: Mar. 18, 2013

(65) Prior Publication Data
US 2013/0230949 A1   Sep. 5, 2013

Related U.S. Application Data

(62) Division of application No. 12/776,829, filed on May 10, 2010, now Pat. No. 8,455,875.

(51) Int. Cl.
*H01L 21/8242* (2006.01)
*H01L 27/12* (2006.01)
(Continued)

(52) U.S. Cl.
CPC ...... *H01L 29/66742* (2013.01); *H01L 27/1203* (2013.01); *H01L 29/945* (2013.01); *H01L 29/66181* (2013.01); *H01L 27/1087* (2013.01); *H01L 21/84* (2013.01)

(58) Field of Classification Search
USPC ............. 257/348, E27.112, E21.32, E21.561, 257/68, 71, E27.084, E21.646, 296; 438/243, 244, 245
See application file for complete search history.

(56) References Cited

U.S. PATENT DOCUMENTS 5,395,784 A   3/1995   Lu et al.
5,627,092 A   5/1997   Alsmeier et al.
(Continued)

FOREIGN PATENT DOCUMENTS

JP   6120446   4/1994
JP   6125055   5/1994
(Continued)

OTHER PUBLICATIONS

Matick, R.E. et al., "Logic-Based eDRAM: Origins and Rationale for Use" Journal of Research and Development (2005) pp. 145-165, vol. 49(1).

(Continued)

*Primary Examiner* — Yu-Hsi D Sun
(74) *Attorney, Agent, or Firm* — Scully, Scott, Murphy & Presser, P.C.; Joseph P. Abate, Esq.

(57) ABSTRACT

A node dielectric and a conductive trench fill region filling a deep trench are recessed to a depth that is substantially coplanar with a top surface of a semiconductor-on-insulator (SOI) layer. A shallow trench isolation portion is formed on one side of an upper portion of the deep trench, while the other side of the upper portion of the deep trench provides an exposed surface of a semiconductor material of the conductive fill region. A selective epitaxy process is performed to deposit a raised source region and a raised strap region. The raised source region is formed directly on a planar source region within the SOI layer, and the raised strap region is formed directly on the conductive fill region. The raised strap region contacts the raised source region to provide an electrically conductive path between the planar source region and the conductive fill region.

14 Claims, 12 Drawing Sheets

(51) Int. Cl.
  *H01L 29/94* (2006.01)
  *H01L 29/66* (2006.01)
  *H01L 27/108* (2006.01)
  *H01L 21/84* (2006.01)

(56) References Cited

U.S. PATENT DOCUMENTS

| | | | |
|---|---|---|---|
| 5,923,971 A * | 7/1999 | Ho et al. | 438/245 |
| 6,225,657 B1 | 5/2001 | Saeki | |
| 6,472,702 B1 | 10/2002 | Shen | |
| 6,509,224 B2 | 1/2003 | Saeki | |
| 6,566,177 B1 | 5/2003 | Radens et al. | |
| 6,590,259 B2 | 7/2003 | Adkisson et al. | |
| 7,176,511 B2 | 2/2007 | Kidoh | |
| 7,195,972 B2 | 3/2007 | Chidambarrao et al. | |
| 2002/0132421 A1 * | 9/2002 | Schrems | 438/241 |
| 2009/0003105 A1 | 1/2009 | Itoh et al. | |
| 2009/0039426 A1 | 2/2009 | Cartier et al. | |
| 2009/0108314 A1 * | 4/2009 | Cai et al. | 257/301 |
| 2009/0134468 A1 | 5/2009 | Tsuchiya et al. | |
| 2009/0256185 A1 | 10/2009 | Cheng et al. | |

FOREIGN PATENT DOCUMENTS

| | | |
|---|---|---|
| JP | 6310680 | 11/1994 |
| JP | 10223860 | 8/1998 |
| JP | 2005197463 | 7/2005 |

OTHER PUBLICATIONS

Cheng, K. et al., "Fully Depleted Extremely This SOI Technology Fabricated by a Novel Integration Scheme Featuring Implant-Fee, Zero-Silicon-Loss, and Faceted Raised Source/Drain" Symposium on VLSI Technology Digest of Technical Papers (2009) pp. 212-213, vol. 11A-3.

Tsuchiya, R. et al., "Low Voltage (Vdd~0.6V) SRAM Operation Achieved by Reduced Threshold Voltage Variability in SOTB (Silicon on Thin BOX)" Symposium on VLSI Technology Digest of Technical Papers (2009) pp. 150-151, vol. 8A-3.

* cited by examiner

EMBEDDED DRAM FOR EXTREMELY THIN SEMICONDUCTOR-ON-INSULATOR

CROSS REFERENCE TO RELATED APPLICATION

This application is a divisional of U.S. patent application Ser. No. 12/776,829, filed May 10, 2010 the entire content and disclosure of which is incorporated herein by reference.

BACKGROUND

The present invention relates to an embedded dynamic random access memory (eDRAM) structure for an extremely thin semiconductor-on-insulator (SOI) substrates and methods of manufacturing the same.

Embedded dynamic random access memory (eDRAM) is a dynamic random access memory (DRAM) embedded in a logic circuit to function as a high density cache memory. The eDRAM provides comparable access time as static random access memory (SRAM) at a smaller device area per cell. Typically, eDRAM arrays are employed as a level-2 (L2) cache or level-3 (L3) cache in a processor to provide a high density memory in a processor core. Due to high performance and a compact size, eDRAM has become one of the most efficient means for continued performance of semiconductor logic circuits requiring embedded memory including processors and system-on-chip (SoC) devices.

Semiconductor-on-insulator (SOI) substrates are employed in the semiconductor industry for performance benefits due to reduced capacitive coupling between semiconductor devices and the bulk portion of the substrate provided by a buried insulator layer. High performance logic chips are frequently manufactured on an SOI substrate to provide enhanced performance over devices having comparable dimensions and manufactured on a bulk substrate. Extremely thin semiconductor-on-insulator (ETSOI) substrate refers to a substrate including an extremely thin semiconductor-on-insulator layer, which typically has a thickness less than 100 nm, and more typically less than 50 nm.

A conventional eDRAM cell employing a deep trench capacitor provides an electrical connection between the deep trench capacitor and a source of an access transistor via a conductive buried strap, which is "buried" underneath a portion of a shallow trench isolation structure. In the case of an ETSOI substrate, the limited thickness of the ETSOI layer presents a unique challenge. The ETSOI layer is too thin to accommodate reliable manufacturing of a buried strap underneath a portion of a shallow isolation trench structure. The thickness of the ETSOI layer limits the vertical range of contact between the buried strap and the source of the access transistor. Further, even moderate variations in the recess depth corresponding to a bottom surface of the buried strap or the recess depth corresponding to the top surface of the buried strap can lead to significant variations in the resistance of the electrical path between the source and the inner node of the deep trench. Nonetheless, controlled and limited resistance between the source of the access transistor and the inner node of the deep trench is necessary to provide high performance from an eDRAM cell.

BRIEF SUMMARY

A node dielectric and a conductive trench fill region filling a deep trench are recessed to a depth that is substantially coplanar with a top surface of a semiconductor-on-insulator (SOI) layer. A shallow trench isolation portion is formed on one side of an upper portion of the deep trench, while the other side of the upper portion of the deep trench provides an exposed surface of a semiconductor material of the conductive fill region. An access transistor is formed in an active region laterally contacting an outer sidewall of the node dielectric. A selective epitaxy process is performed to deposit a raised source region and a raised strap region. The raised source region is formed directly on a planar source region within the SOI layer, and the raised strap region is formed directly on the conductive fill region. The raised strap region contacts the raised source region to provide an electrically conductive path between the planar source region and the conductive fill region.

According to an aspect of the present invention, a semiconductor structure is provided, which includes: a deep trench located in a semiconductor-on-insulator (SOI) substrate that includes a top semiconductor layer containing a planar source region of an access transistor; a conductive trench fill region located in the deep trench and contacting an inner sidewall of the node dielectric; a raised source region located above the top semiconductor layer and contacting an upper surface of the planar source region; and a raised strap region contacting the raised source region and an upper surface of the conductive trench fill region.

According to another aspect of the present invention, a method of forming a semiconductor structure is provided, which includes: forming a deep trench in a semiconductor-on-insulator (SOI) substrate; forming a conductive trench fill region in the deep trench, wherein an active region in a top semiconductor layer of the SOI substrate does not contact the conductive trench fill region; and depositing a semiconductor material by selective epitaxy on an exposed surface of the active region and an exposed surface of the conductive trench fill region, wherein a raised source region is formed directly on the exposed surface of the active region and a raised strap region is formed directly on the exposed surface of the conductive trench fill region, and the raised source region contacts the raised strap region.

DETAILED DESCRIPTION

Figure 1:
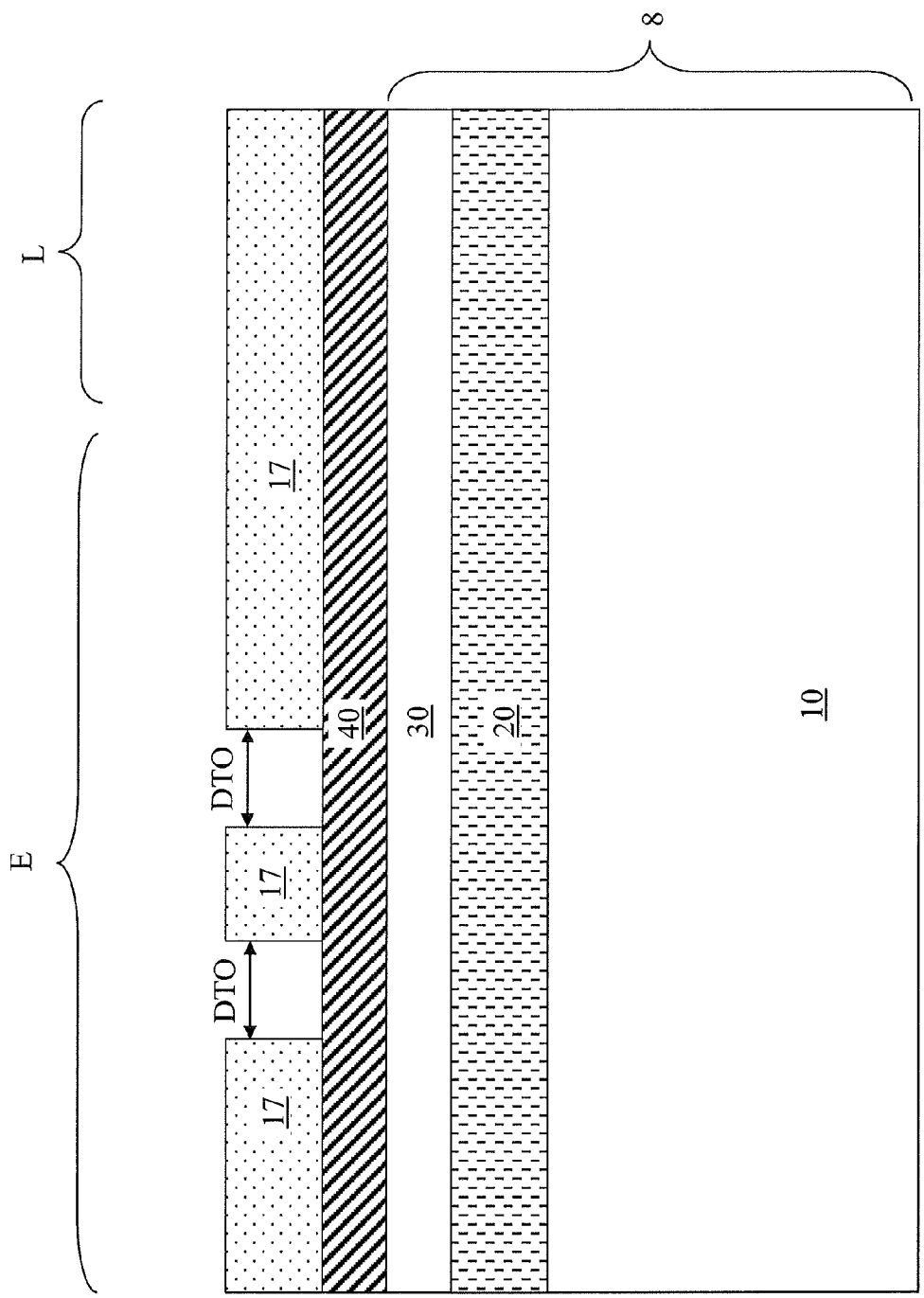
FIG. 1 is a vertical cross-sectional view of a first exemplary semiconductor structure after formation of a pad layer on a semiconductor-on-insulator (SOI) substrate, application of a first photoresist, and lithographic patterning of the first photoresist according to a first embodiment of the present invention.

As stated above, the present invention relates to an embedded dynamic random access memory (eDRAM) structure for an extremely thin semiconductor-on-insulator (SOI) substrates and methods of manufacturing the same, which are now described in detail with accompanying figures. It is noted that like and corresponding elements mentioned herein and illustrated in the drawings are referred to by like reference numerals.

A "deep trench" herein refers to a trench that extends from a top surface of a top semiconductor layer to a depth below a bottom surface of a buried insulator layer in a semiconductor-on-insulator (SOI) substrate.

Referring to FIG. 1, a first exemplary semiconductor structure according to a first embodiment of the present invention includes a semiconductor-on-insulator (SOI) substrate 8, a pad layer 40, and a first masking layer 17. The first exemplary semiconductor structure comprises an embedded dynamic random access memory (eDRAM) region E, in which eDRAM cells are to be subsequently formed, and a logic region L, in which at least another semiconductor device is to be subsequently formed.

The SOI substrate 8 contains a handle substrate 10, a buried insulator layer 20, and a top semiconductor layer 30. The handle substrate 10 comprises a semiconductor material such as silicon. Typically, the handle substrate 10 comprises a single crystalline semiconductor material. The handle substrate 10 can be undoped or have a p-type doping or an n-type doping. If the handle substrate includes a doped semiconductor material, the handle substrate 10 can be doped at a dopant concentration from $1.0 \times 10^{13}/cm^3$ to $3.0 \times 10^{17}/cm^3$.

The buried insulator layer 20 comprises a dielectric material such as silicon oxide and/or silicon nitride. For example and in one embodiment, the buried insulator layer 20 can comprise thermal silicon oxide. The thickness of the buried insulator layer 20 can be from 5 nm to 1000 nm, and typically from 100 nm to 200 nm. The buried insulator layer may comprises multiple dielectric layer, e.g., silicon oxide and silicon nitride.

The top semiconductor layer 30 comprises a semiconductor material. The thickness of the top semiconductor layer 30 can be from 2 nm to 100 nm, and typically from 5 nm to 20 nm, although lesser and greater thicknesses can also be employed. If the top semiconductor layer 30 has a thickness less than 100 nm, the SOI substrate is referred to as an extremely thin semiconductor-on-insulator layer. In one embodiment, the top semiconductor layer 30 comprises a single crystalline semiconductor material. The semiconductor material of the top semiconductor layer 30 can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The top semiconductor layer 30 can have a built-in biaxial stress in a horizontal plane, i.e., in the plane parallel to the interface between the buried insulator layer 20 and the top semiconductor layer 30.

The conductivity type of the portion of the top semiconductor layer 30 within the eDRAM region E is herein referred to as a first conductivity type, which can be p-type or n-type. The portion of the top semiconductor layer 30 within the logic region L can include sub-portions having a doping of the first conductivity type and/or sub-portions having a doping of a second conductivity type, which is the opposite of the first conductivity type. For example, if the first conductivity type is p-type, the second conductivity type is n-type, and vice versa.

The pad layer 40 is formed directly on the top semiconductor layer 30 by a blanket deposition employing, for example, chemical vapor deposition (CVD). In one embodiment, the pad layer 40 comprises a dielectric material such as a dielectric nitride or a dielectric oxide. The pad layer 40 can comprise a stack of multiple dielectric layers or a combination of at least one dielectric layer and at least one semiconductor layer comprising silicon or a silicon containing alloy. For example and in one embodiment, the pad layer 40 is a silicon nitride layer. In another example, the pad layer 40 comprises a stack of a thin silicon oxide layer formed directly on the top semiconductor layer 30, a thicker silicon nitride layer on the thin silicon oxide layer, and a thicker silicon oxide layer on the silicon nitride layer. The thickness of the pad layer 40 can be from 40 nm to 1,000 nm, and typically from 50 nm to 150 nm. In one embodiment, the pad layer 40 can be formed directly on the top semiconductor layer 30 by chemical vapor deposition (CVD).

A first masking layer 17 is applied over the pad layer 40 and lithographically patterned to form openings in the first masking layer 17, which is herein referred to as deep trench openings DTO, in the eDRAM region E.

Figure 2:
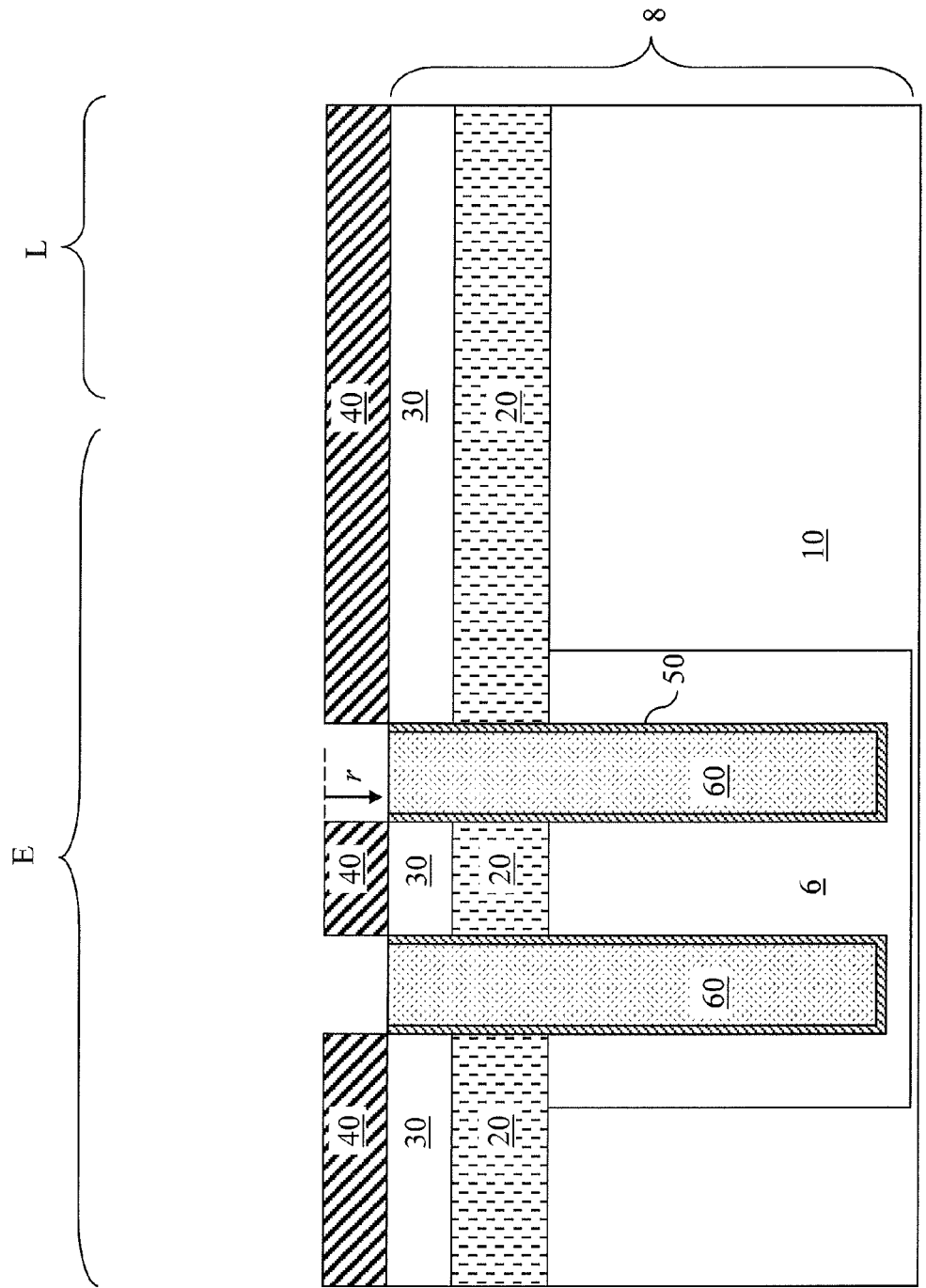
FIG. 2 is a vertical cross-sectional view of the first exemplary semiconductor structure after formation of a deep trench, a buried plate, a node dielectric, a conductive trench fill region, and recessing of the conductive trench fill region and the node dielectric according to the first embodiment of the present invention.

Referring to FIG. 2, the pattern in the first masking layer 17 is transferred into the pad layer 40, the top semiconductor layer 30, the buried insulator layer 20, and the handle substrate 10 to form deep trenches. While a pair of deep trenches is shown in the drawings for illustrative purposes, the present invention can be practiced in other configurations including any number of deep trenches in the eDRAM region E. In one embodiment, the masking layer 17 is a photoresist layer (soft masking layer). In another embodiment, the masking layer 17 comprises hardmask (e.g., silicon oxide).

Specifically, the pattern including the deep trench opening DTO in the first masking layer 17 is transferred into the pad layer 40, the top semiconductor layer 30, the buried insulator layer 20, and an upper portion of the handle substrate 10 to form deep trenches by methods known in the art such as reactive ion etch (RIE). The depth of the deep trenches, as measured from a top surface of the SOI substrate 8 to bottom surfaces of the deep trenches, can be from 0.8 mm to 20 µm, and typically from 2 µm to 8 µm. A portion of the pad layer 40 can be consumed during the formation of the deep trenches or be removed after the formation of the deep trenches.

At least one buried plate 6 is formed outside the sidewalls of the deep trenches. The conductivity type of the dopants can be the same or the opposite of the doping of the remaining portions of the handle substrate 10 if the first handle substrate 10 includes a doped semiconductor material. The buried plate 6 can be formed by diffusing dopants into the handle substrate 10 from within the deep trenches. For example, the at least one buried plate 6 can be formed in the handle substrate 10 by depositing a dopant containing material layer (not shown) such as arsenosilicate glass (ASG) and outdiffusion dopants into the portion of the handle substrate 10 that directly abuts sidewalls of the deep trenches beneath a bottom surface of the buried insulator layer 20. The dopant containing material layer is subsequently removed. The at least one buried plate 6 can be formed by any other alternative method, including but not limited to, ion implantation, gas phase doping, plasma doping, plasma immersion ion implantation, infusion doping, and liquid phase doping. The at least one buried plate 6 can be a plurality of buried plates. Each buried plate 6 can be formed around a single deep trench, or can be formed around a pair of deep trenches. Alternatively, at least a portion of the handle substrate 10 can be doped during fabrication of the SOI substrate. For example, a doped layer can be formed (e.g., by doped epitaxial growth) in the handle substrate 10 before it is bonded to the top semiconductor layer 30 through the buried insulator layer 20.

A node dielectric 50 is formed directly on sidewalls of each deep trench. The node dielectric 50 can comprise silicon oxide, silicon nitride, silicon oxynitride, high-k material, or any combination of these materials. Examples of high-k material include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials. Forming the node dielectric 50, depending on the node dielectric material, can include performing a thermal oxidation, chemical oxidation, thermal nitridation, atomic layer deposition (ALD), chemical vapor deposition (CVD), low-pressure chemical vapor deposition (LPCVD), and/or any other suitable methods. In one embodiment, the node dielectric 50 comprises oxynitride formed by thermal nitridation followed by LPCVD and thermal oxidation.

Subsequently, a conductive trench fill material is deposited, for example, by low pressure chemical vapor deposition (LPCVD). The conductive trench fill material can be, for example, doped polysilicon. Alternative conductive trench fill materials include, but are not limited to, germanium, a silicon germanium alloy, a metal (e.g., tungsten), a conducting metallic compound material (e.g., titanium nitride), and conductive carbon. Using any suitable combination of those conductive materials is also explicitly contemplated herein. Each deep trench is filled with a doped semiconductor material or a combination of a metallic material and a doped semiconductor material such that the upper portion of the deep trench above a top surface of the buried insulator layer 20 is composed of a doped semiconductor material. Thus, at least an upper portion of the conductive trench fill material above the top surface of the buried insulator layer 20 is composed of a doped semiconductor material such as doped polysilicon, doped germanium, a doped silicon germanium alloy, a doped silicon carbon alloy, a doped silicon germanium carbon alloy, a doped III-V compound semiconductor, a doped II-VI compound semiconductor, or a combination thereof. In one embodiment, the entirety of the conductive trench fill material is a doped semiconductor material.

The portion of the conductive trench fill material above the pad layer 40 is removed by planarization, which can employ chemical mechanical polishing (CMP), a dry etch, and/or a wet etch. For example, the trench fill material can be planarized by chemical mechanical polishing (CMP) employing the pad layer 40 as a stopping layer. The portion of the conductive trench fill material within each trench constitutes a conductive trench fill region 60. Each conductive trench fill region 60 is subsequently recessed from a top surface of the pad layer 40 to a recess depth r, for example, by a recess etch. The recess etch can be effected by a reactive ion etch that removes the conductive trench fill material selective to the pad layer 40. The recess depth r substantially coincides, i.e., coincides within the controllability of the recess process step, with the interface between the top semiconductor layer 30 and the pad layer 40. The portion of the node dielectric 50 above the recess depth r of the conductive trench fill region 60 is removed at this point, for example, by a wet etch.

The conductivity type of the doped semiconductor material of the conductive trench fill region 60 is the second conductivity type. The portion of the top semiconductor layer 30 within the eDRAM region E have a doping of the first conductivity type, which is the opposite type of the second conductivity type, at this point. In one embodiment, the second conductivity type is the same as the conductivity type of the doping of the buried plate 6. In another embodiment, the second conductivity type is the opposite of the conductivity type of the doping of the buried plate 6.

After recessing the conductive trench fill regions 60, each node dielectric 50 extends from the bottom surface of the corresponding deep trench to a vertical height above the topmost surface of the buried insulator layer 20, i.e., above the interface between the buried insulator layer 20 and the top semiconductor layer 30. Thus, the topmost surface of the node dielectric 50 and the topmost surface of the conductive trench fill region 60 within each deep trench are located above the topmost surface of a buried insulator layer 20 after the recessing.

Figure 3:
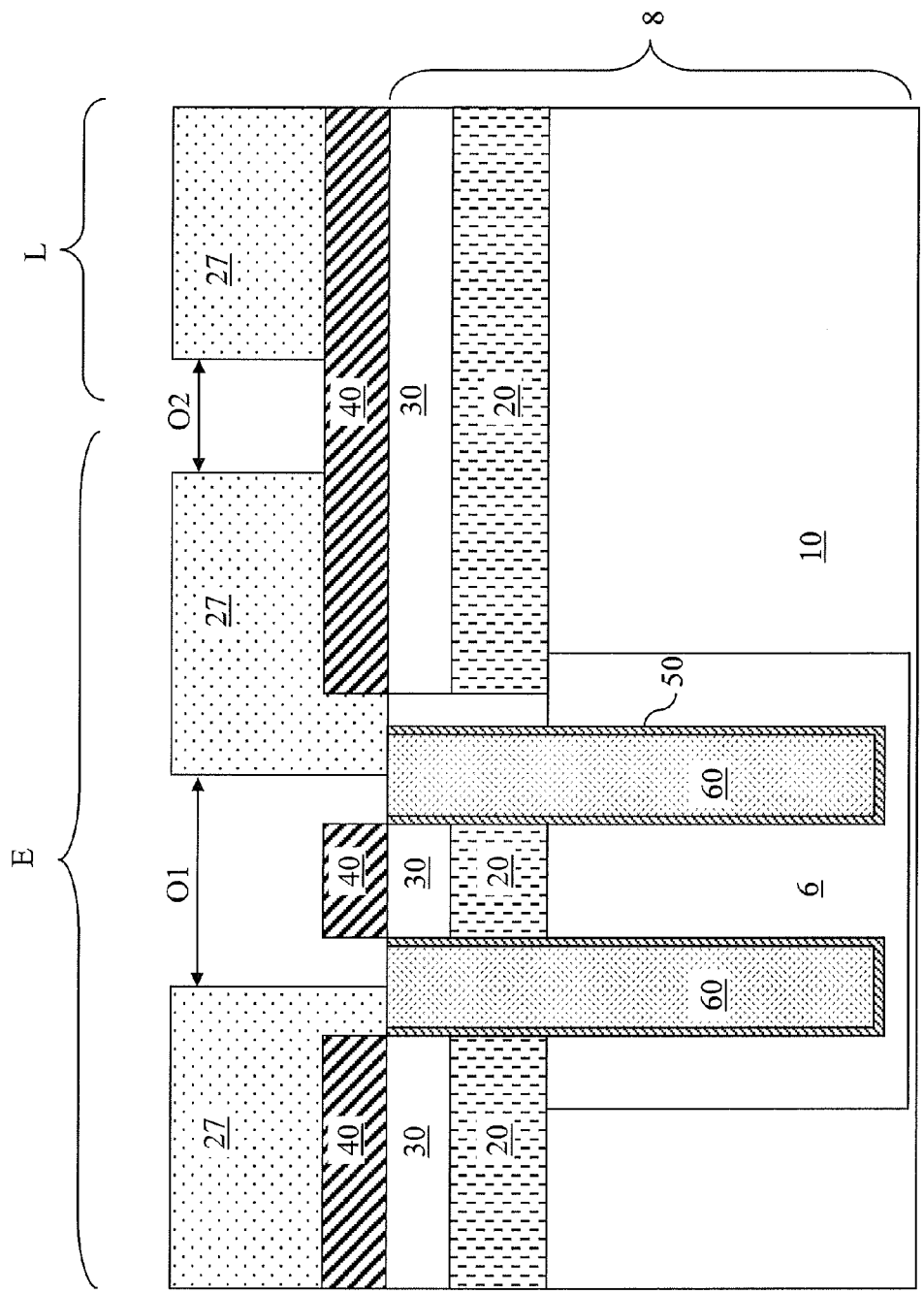
FIG. 3 is a vertical cross-sectional view of the first exemplary semiconductor structure after application of a second masking layer and lithographic patterning of the second masking layer according to the first embodiment of the present invention.

Referring to FIG. 3, a second masking layer 27 is applied over the pad layer 40 and the conductive trench fill regions 60. The second masking layer 27 can be a soft masking layer (e.g., photoresist) or a hardmask layer (e.g., silicon oxide). At least one first opening O1 and at least one second opening O2 are formed in the second masking layer 90 by lithographic methods. Specifically, the second masking layer 27 is lithographically patterned to form a first opening O1 over each pair of deep trenches, or alternately over each deep trench if deep trenches are laterally separated without forming adjacent pairs, in the eDRAM region E. An edge of the patterned second masking layer 27 around a first opening O1 overlies a middle portion of each conductive trench fill region 60. Further, the pattern in the second masking layer 27 includes the at least one second opening O2, which is located outside the area of the deep trenches. Each second opening O2 can be located at a boundary between the eDRAM region E and the logic region L or within the logic region L.

Figure 4:
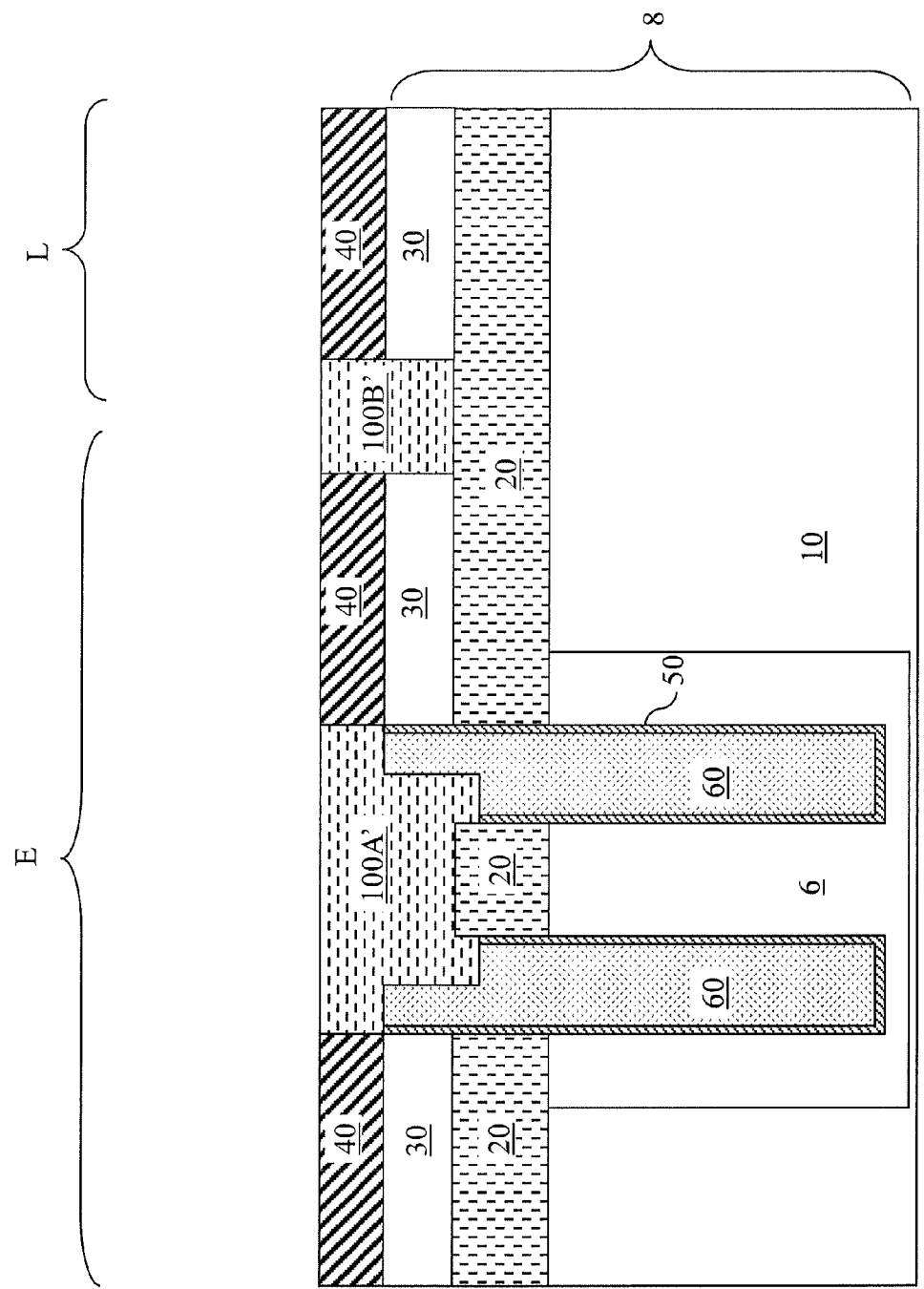
FIG. 4 is a vertical cross-sectional view of the first exemplary semiconductor structure after formation of a prototype shallow trench isolation structures according to the first embodiment of the present invention.

Referring to FIG. 4, the pattern of the at least one first opening O1 and the at least one second opening O2 is transferred into the top semiconductor layer 30 and the conductive trench fill region 60, for example, by at least one anisotropic etch. The at least one anisotropic etch can include a first anisotropic etch that removes exposed portions of the pad layer 40. In one embodiment, the first etch can be selective to the material of the conductive trench fill region 60. The at least one anisotropic etch can include a second anisotropic etch, which can be employed after the first anisotropic etch to etch the exposed portions of the top semiconductor layer 30 and the exposed portions of the conductive trench fill region 60 within the at least one first opening O1 and the at least one second opening O2. The portion of the node dielectric 50 between removed portions of the top semiconductor layer 30 and the removed portions of the conductive trench fill regions 60 can be removed during the second anisotropic etch or during a subsequent dry etch or a subsequent wet etch. The second etch can be end-pointed upon detection of the top surface of the buried insulation layer 20 with, or without a built-in overetch. Cavities are formed within upper portions of the SOI substrate 8, which are herein referred to as shallow trenches, i.e., trenches that do not extend below the bottom surface of the buried insulator layer 20. The shallow trenches can include portions that extend deeper than exposed portions of the top surface of the buried insulator layer 20. The second masking layer 27 can be subsequently removed selective to the pad layer 40.

A dielectric material such as silicon oxide is deposited within each shallow trench and is subsequently planarized to form various prototype shallow trench isolation structures, which include at least one first prototype shallow trench isolation structure 100A' and at least one second prototype shallow trench isolation structure 100B' corresponding to the area of the at least one first opening O1 in FIG. 3 and the area of the at least one second opening O2 in FIG. 3, respectively. After planarization, the top surfaces of the at least one first prototype shallow trench isolation structure 100A' and the at least one second prototype shallow trench isolation structure 100B' are coplanar with the top surface of the pad layer 40.

Figure 5:
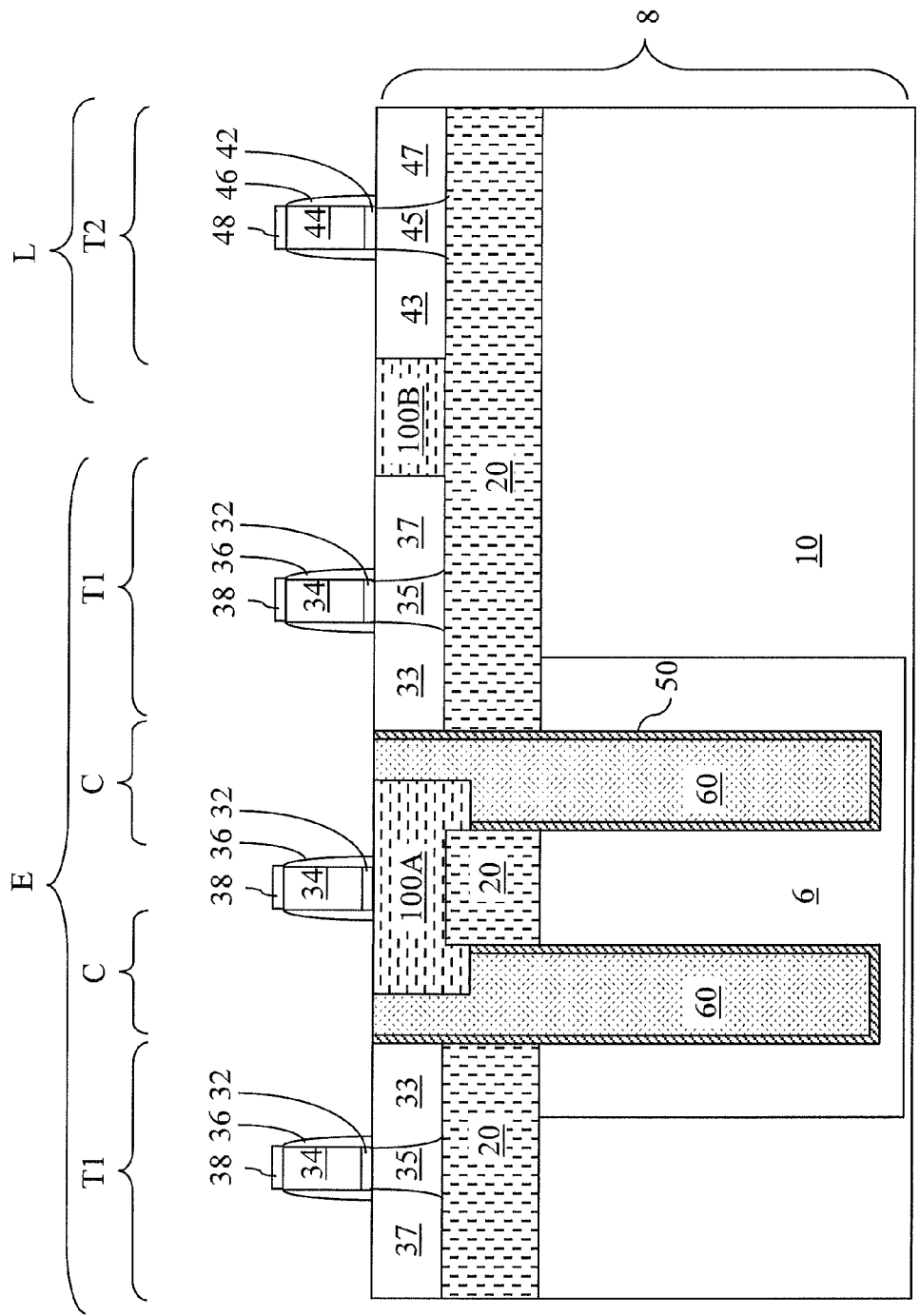
FIG. 5 is a vertical cross-sectional view of the first exemplary semiconductor structure after formation of gate stacks and various planar source and drain regions according to the first embodiment of the present invention.

Referring to FIG. 5, the prototype shallow trench isolation structures (100A', 100B') are recessed to a depth so that top surfaces of the conductive trench fill regions 60 are exposed after the recess etch. The pad layer 40 is removed selective to the top semiconductor layer 30, the conductive trench fill regions 60, and the remaining portions of the prototype shallow trench isolation structures (100A', 100B'). The pad layer 40 can be removed, for example, by a wet etch. If the pad layer 40 comprises silicon nitride, the wet etch can employ hot phosphoric acid. Each remaining portion of a first prototype shallow trench isolation structure 100A' is herein referred to as a first shallow trench isolation structure 100A. Each remaining portion of a second prototype shallow trench isolation structure 100B' is herein referred to as a second shallow trench isolation structure 100B. The top surfaces of the conductive trench fill regions 60, the first shallow trench isolation structure(s) 100A, and the second shallow trench isolation structure(s) 100B can be substantially coplanar with one another, i.e., coplanar within the limitations of the processes employed to form the various surfaces.

Because the topmost surfaces of the conductive trench fill regions 60 are exposed after the recess etch, the lateral extent of each first shallow trench isolation structure 100A does not encompass the entirety of a deep trench area. Consequently, the topmost surface of each conductive trench fill region 60 does not underlie the first shallow trench isolation structure 100A located thereupon. The topmost surface of each conductive fill region 60 is exposed at this step.

The remaining portions of the top semiconductor layer 30 constitute active regions, i.e., semiconductor regions on which semiconductor devices are formed. Transistors are subsequently formed on the active regions. For example, the transistors can include at least one first transistor T1 located in the eDRAM region E and at least one second transistor T2 located in the logic region L. Each of the at least one first transistor T1 is an access transistor for a capacitor C, which includes a buried plate 6 as an outer electrode, a node dielectric 50, and a conductive trench fill regions 60 as an inner electrode. The active regions do not contact any conductive trench fill region 60. Each active region within the eDRAM region E is laterally spaced from an adjacent conductive trench fill region 60 by a node dielectric 50.

Gate stacks are formed on the active regions employing methods known in the art. For example, at least one first gate stack is formed on the active regions within the eDRAM region E, and at least one second gate stack is formed on the active regions within the logic region L. Each first gate stack includes a first gate dielectric 32, a first gate conductor 34, and optionally a first dielectric gate cap 38. A first dielectric gate spacer 36 is typically formed on sidewalls of each first gate stack. Each second gate stack includes a second gate dielectric 42, a second gate conductor 44, and optionally a second dielectric gate cap 48. A second dielectric gate spacer 46 is typically formed on sidewalls of each second gate stack. Each portion of a first gate stack (32, 34) over a first shallow trench isolation structure 100A is referred to as passing gate stack, and each portion of a first gate stack (32, 34) over an active region is referred to as an active gate stack. A gate stack structure typically includes multiple active gate stacks and multiple passive gate stacks that alternate over active regions and first shallow trench isolation structures 100A. At this step, the active regions within the eDRAM region E have a doping of the first conductivity type.

Subsequently, dopants of the second conductivity type are introduced, for example, by conventional ion implantation or plasma doping, into exposed portions of the top semiconductor layer 30 within the eDRAM region E to form first planar source regions 33 and first planar drain regions 37. The first gate stacks (32, 34) are employed as a mask during the conventional ion implantation or the plasma doping. Additional implantation masks may be implanted to protect portions of active areas within the logic region L from implantation of ions. The conventional ion implantation and the plasma doping are herein collective referred to as ion implantation. Alternatively, the formation of the source regions 33 and the drain regions 37 can be omitted at this step as they can be formed in the subsequent raised source/drain process by forming doped RSD and then outdiffusing dopants in RSD into the semiconductor layer 30 to form the source/drain regions.

The portions of the top semiconductor layer 30 underlying the first gate stacks (32, 34) within the eDRAM region E constitute a first body region 35 of one of the at least one first transistor T1. The first body regions 35 have a doping of the first conductivity type, and the first planar source regions 33 and the first planar drain regions 37 have a doping of the second conductivity type. The first planar source regions 33 and the first planar drain regions 37 are located within the active regions of the eDRAM region E between the topmost surface of the buried insulator layer 20 and the topmost surface of the SOI substrate 8. Each first transistor T1 includes a first gate dielectric 32, a first gate electrode 34, a first body region 35, a first planar source region 33, and a first planar drain region 37. Each node dielectric 50 is located in a deep trench and contacts a sidewall of a planar source region 33. Each conductive fill region 60 does not contact any first planar source region 33, and is laterally spaced from the most adjacent first planar source region 33 by a node dielectric 50. An outer sidewall of each first shallow trench isolation structure 100A is laterally spaced from the most adjacent first planar source region 33 by a portion of a node dielectric 50 and an upper portion of the conductive trench fill region 60.

Additional dopants can be introduced by ion implantation into exposed portions of the top semiconductor layer 30 within the logic region L to form second planar source regions 43 and second planar drain regions 47. The second gate stacks (42, 44) are employed as a mask during the ion implantation. Additional implantation masks may be implanted to protect the eDRAM region E and/or other active areas within the logic region L from implantation of ions.

The portions of the top semiconductor layer 30 underlying the second gate stacks (42, 44) within the logic region L constitute a second body region 45 of one of the at least one second transistor T2. Within each second transistor T2, the second body region 45 has a doping of the opposite conductivity type than the second planar source region 43 and the second planar drain region 47. The logic region L may contain p-type transistors and n-type transistors to provide complementary metal-oxide-semiconductor (CMOS) devices.

Figure 6:
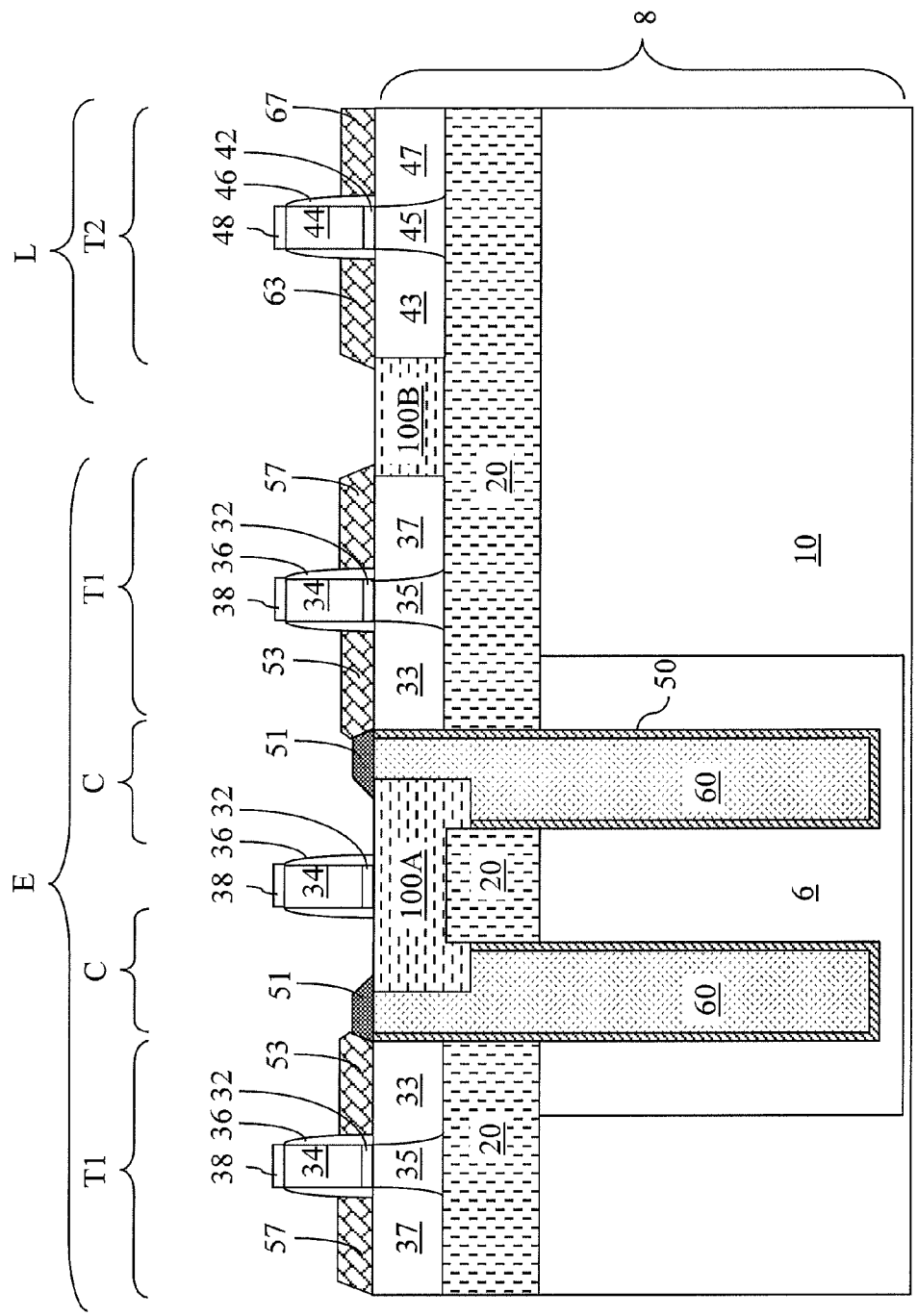
FIG. 6 is a vertical cross-sectional view of the first exemplary semiconductor structure after formation of raised source regions, raised strap regions, and raised drain regions according to the first embodiment of the present invention.

Referring to FIG. 6, various raised source regions, various raised strap regions, and various raised drain regions are formed by selective epitaxy of a semiconductor material. Specifically, a semiconductor material is deposited by selective epitaxy on exposed surfaces of the active regions and exposed surfaces of the conductive trench fill regions. During the selective epitaxy, the semiconductor material is deposited only on semiconductor surfaces, but is not deposited on dielectric surfaces such as the surfaces of the first and second dielectric gate caps (38, 48), the first and second dielectric gate spacers (36, 46) and the first and second shallow trench isolation structures (100A, 100B). A first raised source region 53 is formed directly on each exposed surface of the first planar source regions 33. A first raised drain region 57 is formed directly on each exposed surface of the first planar drain regions 37. A raised strap region 51 is formed directly on each exposed surface of the conductive trench fill regions 60. Due to the lateral growth of the deposited semiconductor material, each first raised drain region 57 laterally contacts an adjacent raised strap region 51, thereby providing an electrically conductive path from a planar source region 33 to a conductive trench fill region 60. A second raised source region 63 is formed directly on each exposed surface of the second planar source regions 43. A second raised drain region 67 is formed directly on each exposed surface of the second planar drain regions 47. The first raised source regions 53, the first raised drain regions 57, the raised strap regions 51, the second raised source regions 63, and the second raised drain regions 67 are formed above the SOI substrate 8.

Because the first planar source regions 33, the first planar drain regions 37, the second planar source regions 43, and the second planar drain regions 47 are single crystalline and the selective epitaxy preserves epitaxial alignment between the underlying semiconductor material portions and the deposited semiconductor material portions, the first raised source regions 53, the first raised drain regions 57, the second raised source regions 63, and the second raised drain regions 67 are single crystalline. Because the conductive trench fill regions 60 are polycrystalline, the raised strap regions 51 are also polycrystalline.

Further, because the growth rate of a single crystalline semiconductor material is greater than the growth of a polycrystalline semiconductor material at the same deposition condition, i.e., temperature, pressure, and reactant supply, the thickness of the first raised source regions 53, the first raised drain regions 57, the second raised source regions 63, and the second raised drain regions 67 is typically greater than the thickness of the raised strep regions 51. In one embodiment, each of the first raised source regions 53, the first raised drain regions 57, the second raised source regions 63, and the second raised drain regions 67 has substantially the same thickness, which is greater than the thickness of the raised strap regions 51.

In one embodiment, the first raised source regions 53, the first raised drain regions 57, the second raised source regions 63, and the second raised drain regions 67 are deposited as single crystalline doped semiconductor regions during the selective epitaxy, and the raised strap regions 51 are deposited as polycrystalline doped semiconductor regions during the selective epitaxy.

In another embodiment, a thin dielectric layer (not shown) can be employed as a masking layer and selective epitaxy may be employed to effect deposition of a doped semiconductor material only within the eDRAM region E. Alternately, the masking layer may be employed to effect deposition of the doped semiconductor material within the eDRAM region E and a subset of the at least one second transistor T2 having second planar source and drain regions (43, 47) having a same conductivity type as the first planar source and drain regions (33, 37).

In still another embodiment, the first raised source regions 53, the first raised drain regions 57, the second raised source regions 63, and the second raised drain regions 67 are deposited as single crystalline undoped semiconductor regions during the selective epitaxy, and the raised strap regions 51 are deposited as polycrystalline undoped semiconductor regions during the selective epitaxy. The first raised source regions 53, the first raised drain regions 57, and the raised strap regions 51 are subsequently implanted with dopants of the second conductivity type. The second raised source regions 63 and the second raised drain regions 67 are subsequently implanted with dopants of a conductivity type that matches the underlying second planar source or drain regions (43, 47).

In one embodiment, the planar source regions (33, 43) and the planar drain regions (37, 47) extend from the top surface of the buried insulator layer 20 to the topmost surface of the SOI substrate 8. In this case, the at least one first transistor T1 and the at least one second transistor T2 are fully depleted transistors.

Within each first transistor T1, a first planar source region 33 and a first raised source region 53 collectively constitute the source region of the first transistor T1, and a first planar drain region 37 and a first raised drain region 57 collectively constitute the drain region of the first transistor T1. Within each second transistor T2, a second planar source region 43 and a second raised source region 63 collectively constitute the source region of the second transistor T2, and a second planar drain region 47 and a second raised drain region 67 collectively constitute the drain region of the second transistor T2.

Figure 7:
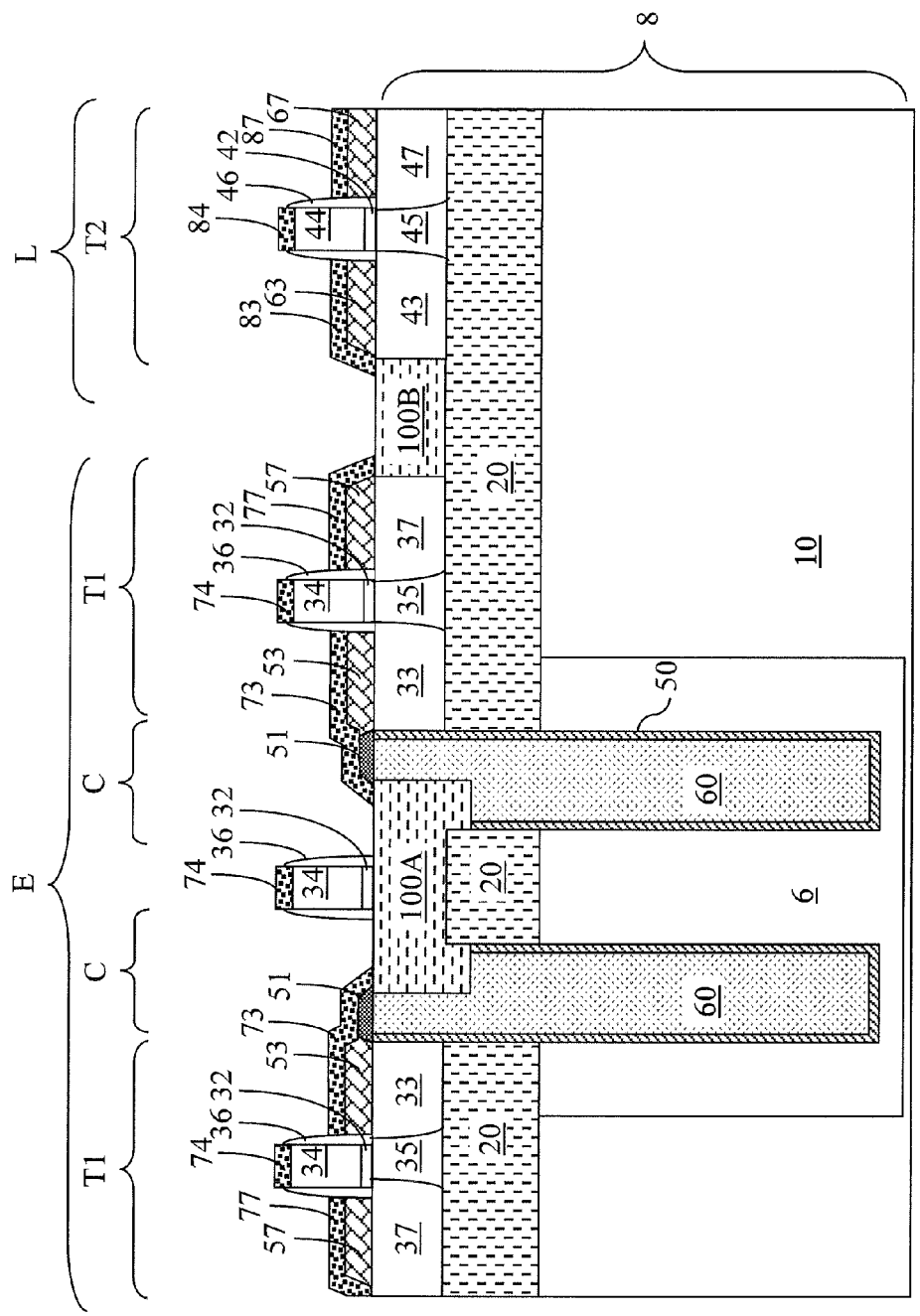
FIG. 7 is a vertical cross-sectional view of the first exemplary semiconductor structure after formation of various metal semiconductor alloy portions according to the first embodiment of the present invention.

Referring to FIG. 7, various metal semiconductor alloy portions are formed on exposed semiconductor surfaces. The first and second dielectric gate caps (38, 48) can be removed prior to formation of the various metal semiconductor alloy portion so that metal semiconductor alloy portions can be formed on the first and second gate conductors (34, 44). The various metal semiconductor alloy portions can be formed by depositing a metal layer (not shown) and inducing a reaction between the metal layer and underlying semiconductor material portions.

In case the semiconductor substrate comprises silicon, the metal semiconductor alloys are silicides. The metal layer comprises a metal that can react with silicon to form a metal silicide. For example, the metal can be Ti, Co, Ni, Ta, W, Pt, Pd or an alloy thereof. The typical thickness of the metal layer ranges from 10 nm to 50 nm, more typically from 5 nm to 20 nm. Such a metal layer can be readily deposited by any suitable deposition technique, including, but not limited to: atomic layer deposition (ALD), chemical vapor deposition (CVD), and physical vapor deposition (PVD). The metal layer can be deposited alone, or together with a metal nitride capping layer (not shown) containing TiN or TaN and having a thickness ranging from 5 nm to 50 nm, and typically from 10 nm to 20 nm.

After deposition of the metal layer and/or the metal nitride capping layer, the entire structure is annealed at a pre-determined elevated temperature at which the deposited metal layer reacts with exposed silicon to form metal silicides of relatively low contact resistance. The annealing is typically performed in an inert gas atmosphere, e.g., He, Ar, $N_2$, or forming gas, at relatively low temperatures ranging from 100° C. to 600° C., typically from 300° C. to 500° C., and more typically from 300° C. to 450° C., by using a continuous heating regime or various ramp and soak heating cycles. Unreacted metal and/or metal nitride are removed after formation of the metal silicides. For certain metals such as Co, Ti, or Ni, a second annealing step can be employed to form metal silicides of lower resistivity, such as $CoSi_2$, $TiSi_2$, or NiSi.

A first source-side metal semiconductor alloy portion 73 is formed on an upper surface of each contiguous pair of a first raised source region 53 and a raised strap region 51. A first drain-side metal semiconductor alloy portion 77 is formed on an upper surface of each first raised drain region 57. A second source-side metal semiconductor alloy portion 83 is formed on an upper surface of each second raised source region 63. A second drain-side metal semiconductor alloy portion 87 is formed on an upper surface of each second raised drain region 67. A first gate-side metal semiconductor alloy portion 74 can be formed on each first gate conductor 34, and a second gate-side metal semiconductor alloy portion 84 can be formed on each second gate conductor 44.

Figure 8:
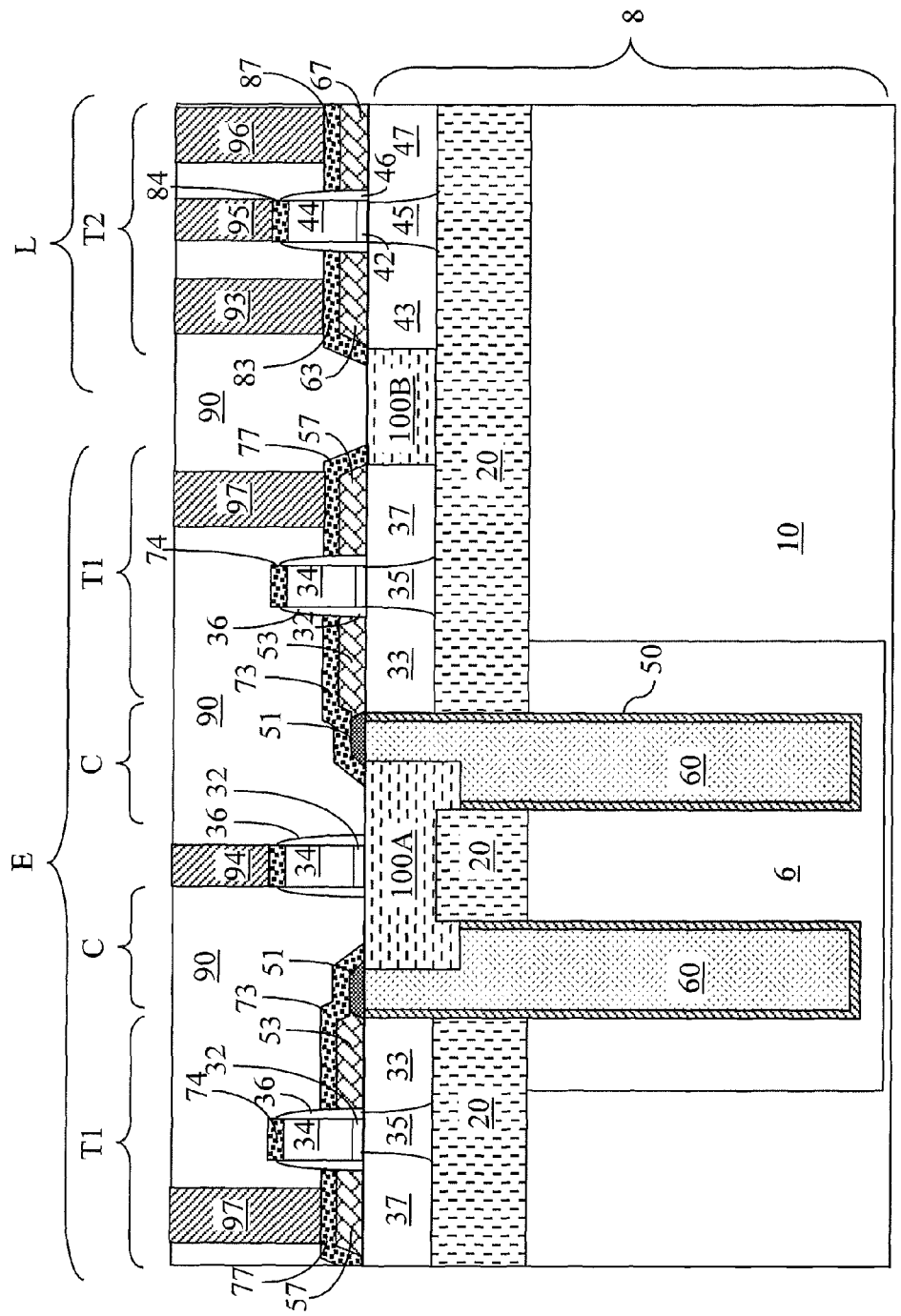
FIG. 8 is a vertical cross-sectional view of the first exemplary semiconductor structure after formation of a dielectric layer and contact via structures embedded therein according to the first embodiment of the present invention.
Figure 9:
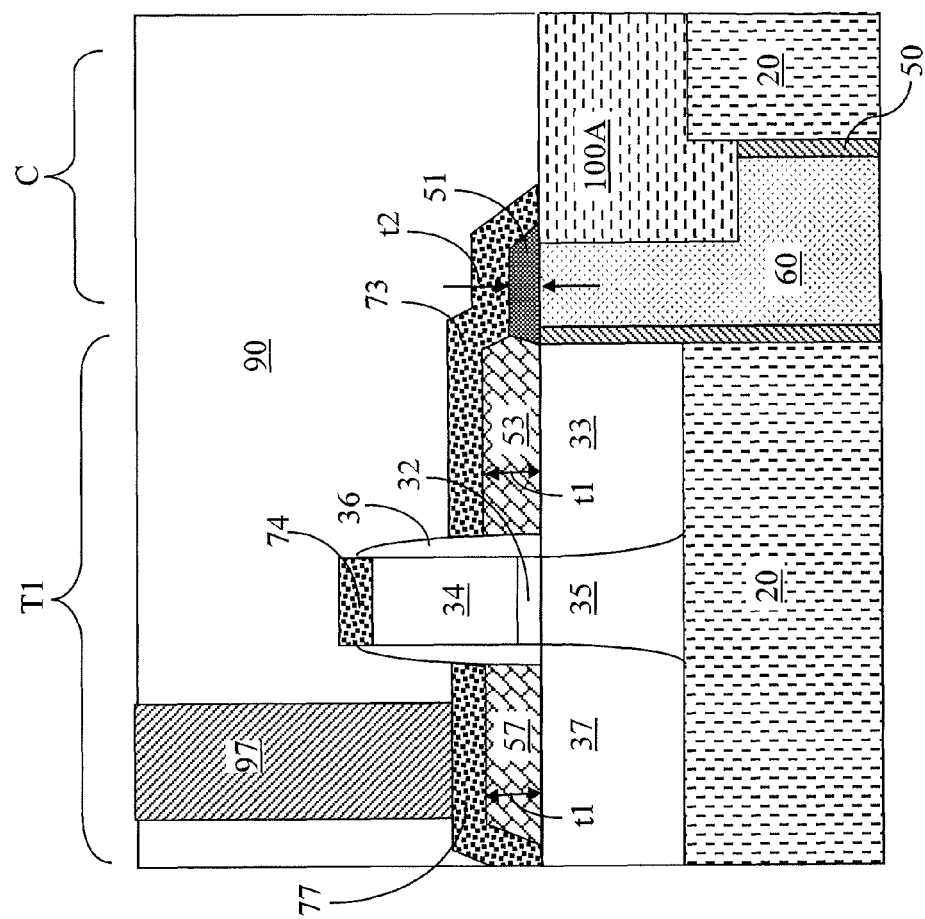
FIG. 9 is a magnified view of a portion of the first exemplary semiconductor structure of FIG. 8.

Referring to FIGS. 8 and 9, a middle-of-line (MOL) dielectric layer 90 is deposited the various metal semiconductor alloy portions (73, 77, 74, 83, 87, 84). The MOL dielectric layer 90 can comprise, for example, a CVD oxide. The CVD oxide can be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 82 can be from 200 nm to 500 nm. The MOL dielectric layer 90 is typically planarized, for example, by chemical mechanical polishing (CMP).

Various contact via holes are formed in the MOL dielectric layer 90 and filled with metal to from various contact via structures. Specifically, bit line contact via structures 97 can be formed to contact each of the first drain-side metal semiconductor alloy portions 77. Word line contact via structures 94 can be formed to contact each of the first gate-side metal semiconductor alloy portions 74. The first source-side metal semiconductor alloy portion 73 need not be contacted by a conductive via because a DRAM cell does not require an external connection between an access transistor and a capacitor. A source-side contact via structure 93 can be formed to contact each of the second source-side metal semiconductor alloy portions 83. A drain-side contact via structure 96 can be formed to contact each of the second drain-side metal semiconductor alloy portions 87. A gate-side contact via structure 94 can be formed to contact each of the second gate-side metal semiconductor alloy portions 84.

The thickness of the planar portions, i.e., portions having a constant thickness, of the first raised source regions 53, the first raised drain regions 57, the second raised source regions 63, and the second raised drain regions 67 after formation of the various metal semiconductor alloy portions (73, 77, 74, 83, 87, 84) is herein referred to as a first thickness t1. The thickness of the planar portions of the raised strap regions 51 is herein referred to as a second thickness t2. The first thickness t1 is greater than the second thickness t2. For example, the first thickness t1 can be from 3 nm to 60 nm, and the second thickness t2 can be from 1.5 nm to 30 nm. Typically, the second thickness t2 is from 25% to 75% of the first thickness t1.

Figure 10:
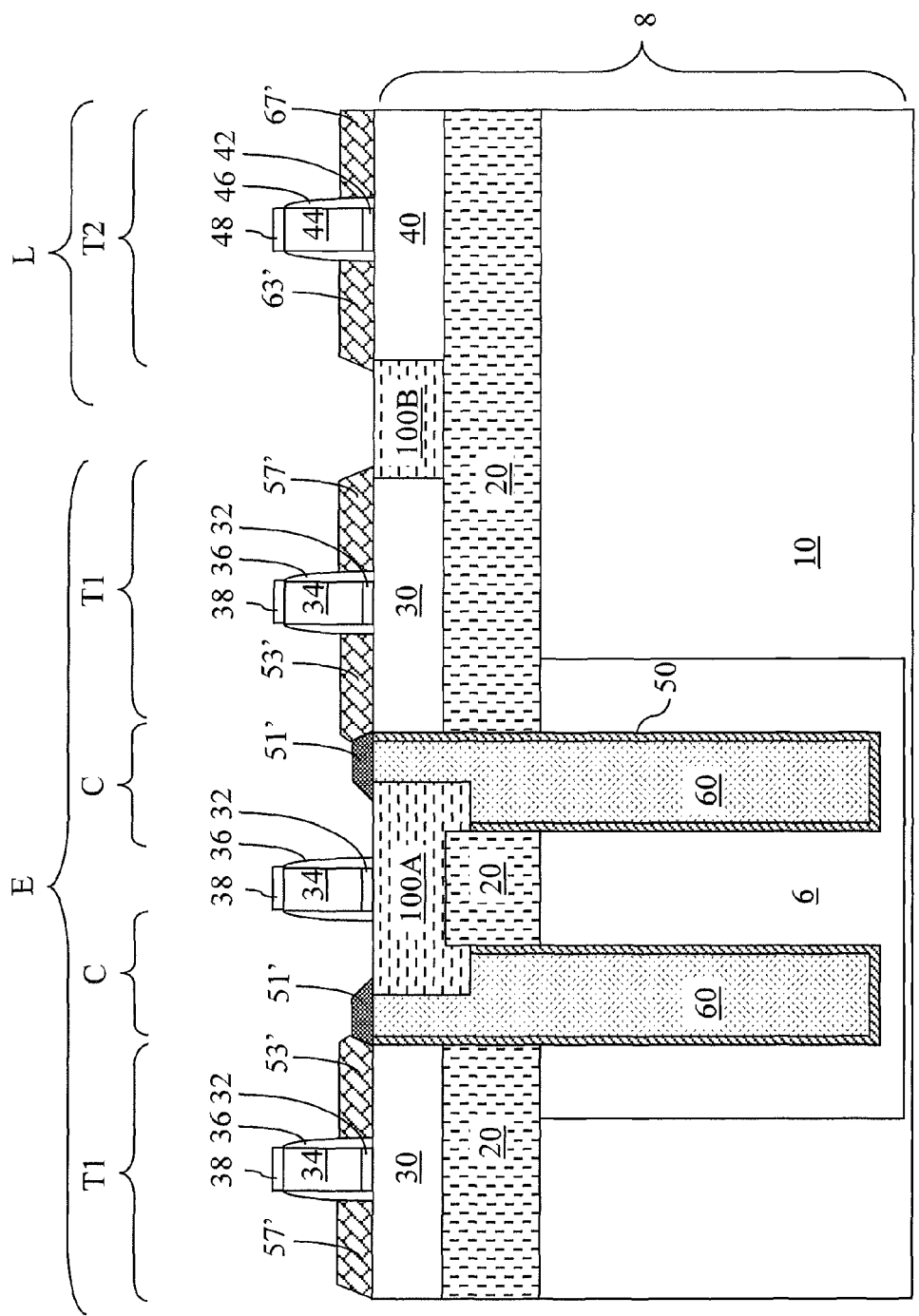
FIG. 10 is a vertical cross-sectional view of a second exemplary semiconductor structure after selective epitaxy of raised source regions, raised strap regions, and raised drain regions according to a second embodiment of the present invention.

Referring to FIG. 10, a second exemplary semiconductor structure according to a second embodiment of the present invention is derived from the first exemplary semiconductor structure of FIG. 4. Specifically, the first and second prototype shallow trench isolation structures (100A', 100B') are recessed to form first and second shallow trench isolation structures (100A, 100B) employing the same methods as in the first embodiment. Subsequently, the pad layer 40 is removed. First and second gate stacks (32, 34, 38, 42, 44, 48) and first and second dielectric gate spacers (36, 46) are formed in the same manner as in the first embodiment.

Selective epitaxy of an undoped semiconductor material is subsequently performed. During the selective epitaxy, the undoped semiconductor material is deposited only on semiconductor surfaces, but is not deposited on dielectric surfaces such as the surfaces of the first and second dielectric gate caps (38, 48), the first and second dielectric gate spacers (36, 46) and the first and second shallow trench isolation structures (100A, 100B). A first undoped raised source region 53' is formed directly on each exposed surface of the first planar source regions 33. A first undoped raised drain region 57' is formed directly on each exposed surface of the first planar drain regions 37. An undoped raised strap region 51' is formed directly on each exposed surface of the conductive trench fill regions 60. Due to the lateral growth of the deposited semiconductor material, each first raised drain region 57 laterally contacts an adjacent raised strap region 51, thereby providing a physically contiguous adjoined semiconductor material portions above a planar source region 33 and a conductive trench fill region 60. A second undoped raised source region 63' is formed directly on each exposed surface of the second planar source regions 43. A second undoped raised drain region 67' is formed directly on each exposed surface of the second planar drain regions 47. The first undoped raised source regions 53', the first undoped raised drain regions 57', the undoped raised strap regions 51', the second undoped raised source regions 63', and the second undoped raised drain regions 67' are formed above the SOI substrate 8.

Because the first planar source regions 33, the first planar drain regions 37, the second planar source regions 43, and the second planar drain regions 47 are single crystalline and the selective epitaxy preserves epitaxial alignment between the underlying semiconductor material portions and the deposited semiconductor material portions, the first undoped raised source regions 53', the first undoped raised drain regions 57', the second undoped raised source regions 63', and the second undoped raised drain regions 67' are single crystalline. Because the conductive trench fill regions 60 are polycrystalline, the undoped raised strap regions 51' are also polycrystalline.

Further, because the growth rate of a single crystalline semiconductor material is greater than the growth of a polycrystalline semiconductor material at the same deposition condition, i.e., temperature, pressure, and reactant supply, the thickness of the first undoped raised source regions 53', the first undoped raised drain regions 57', the second undoped raised source regions 63', and the second undoped raised drain regions 67' is typically greater than the thickness of the undoped raised strep regions 51'. In one embodiment, each of the first undoped raised source regions 53', the first undoped raised drain regions 57', the second undoped raised source regions 63', and the second undoped raised drain regions 67' has substantially the same thickness, which is greater than the thickness of the undoped raised strap regions 51'.

Dopants are introduced into the first undoped raised source regions 53', the first undoped raised drain regions 57', the second undoped raised source regions 63', the second undoped raised drain regions 67', and the undoped raised strap regions 51' by ion implantation employing at least the first and second gate stacks (32, 34, 38, 42, 44, 48) as an implantation mask. Additional masking layer(s) can be optionally employed to limit the area of ion implantation for each round of ion implantation. For example, a first masking layer can be employed to expose areas of n-type transistors, while blocking areas for p-type transistors during implantation of n-type dopants. Subsequently, a second masking layer can be employed to expose areas of p-type transistors, while blocking areas for n-type transistors during implantation of p-type dopants.

The first undoped raised source regions 53', the first undoped raised drain regions 57', the undoped raised strap regions 51', the underlying portions of the top semiconductor layer 30 beneath the first undoped raised source regions 53', and the underlying portions of the top semiconductor layer 30 beneath the first undoped raised drain regions 57' are implanted with dopants of the second conductivity type. The second undoped raised source regions 63', the second undoped raised drain regions 67', the underlying portions of the top semiconductor layer 30 beneath the second undoped raised source regions 63', and the underlying portions of the top semiconductor layer 30 beneath the second undoped raised drain regions 67' are implanted with dopants of appropriate conductivity type(s). The resulting structure is identical to the structure shown in FIG. 6 according to the first embodiment.

Figure 11:
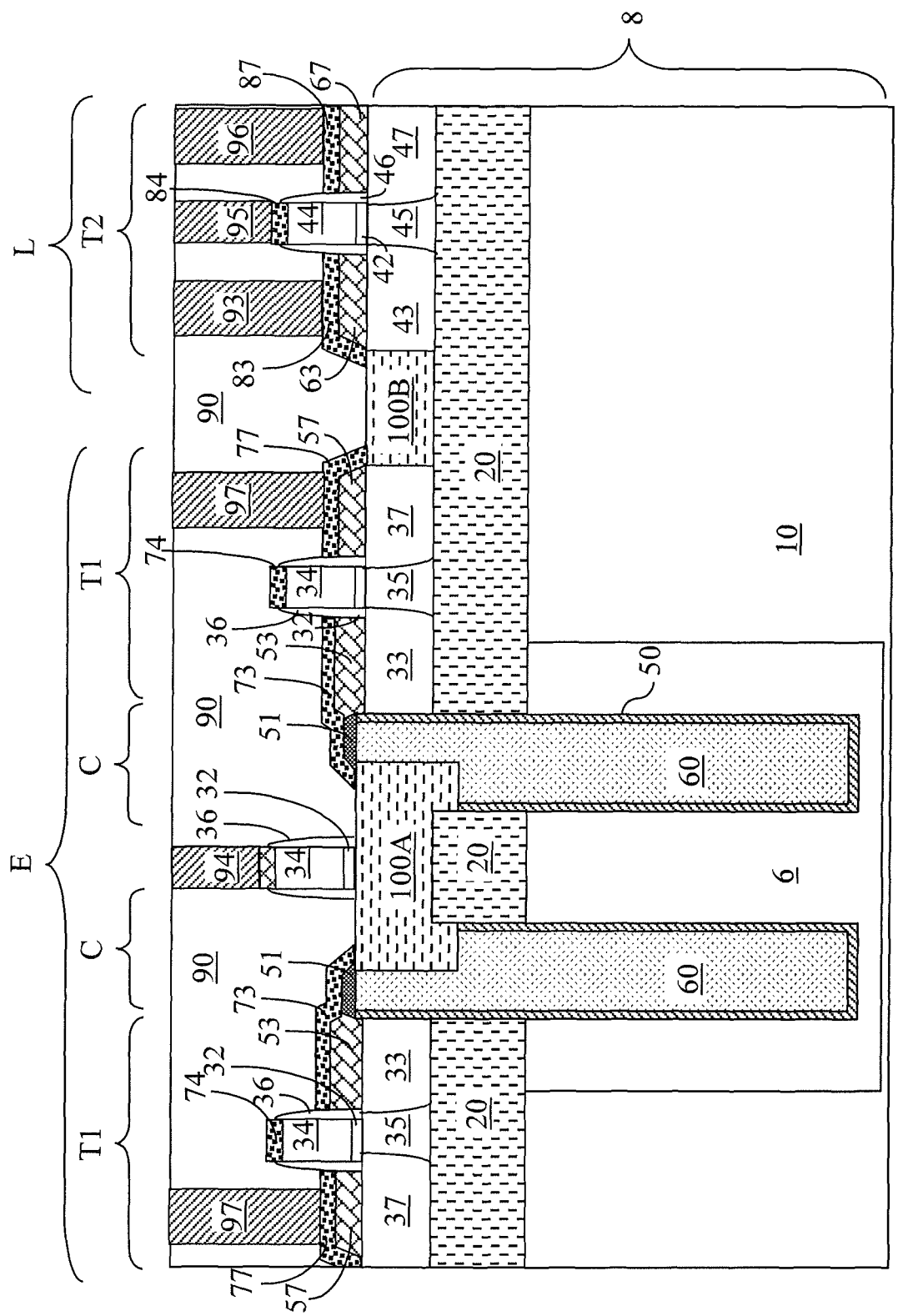
FIG. 11 is a vertical cross-sectional view of a third exemplary semiconductor structure according to the third embodiment of the present invention.

Referring to FIG. 11, a third exemplary semiconductor structure according to the third embodiment of the present invention can be derived from the first exemplary semiconductor structure by setting the recess depth r in FIG. 2 to be lesser than the thickness of the pad layer 40. In this case, the interface between a raised strap region 51 and an underlying conductive trench fill region 60 is vertically offset so that the interface is located at a higher level than the interface between a first raised source region 53 and an underlying first planar source region 33. In this case, the node dielectric 50 can extend from a bottom surface of the deep trench up to the interface between the raised strap region 51 and the conductive trench fill region 60.

Figure 12:
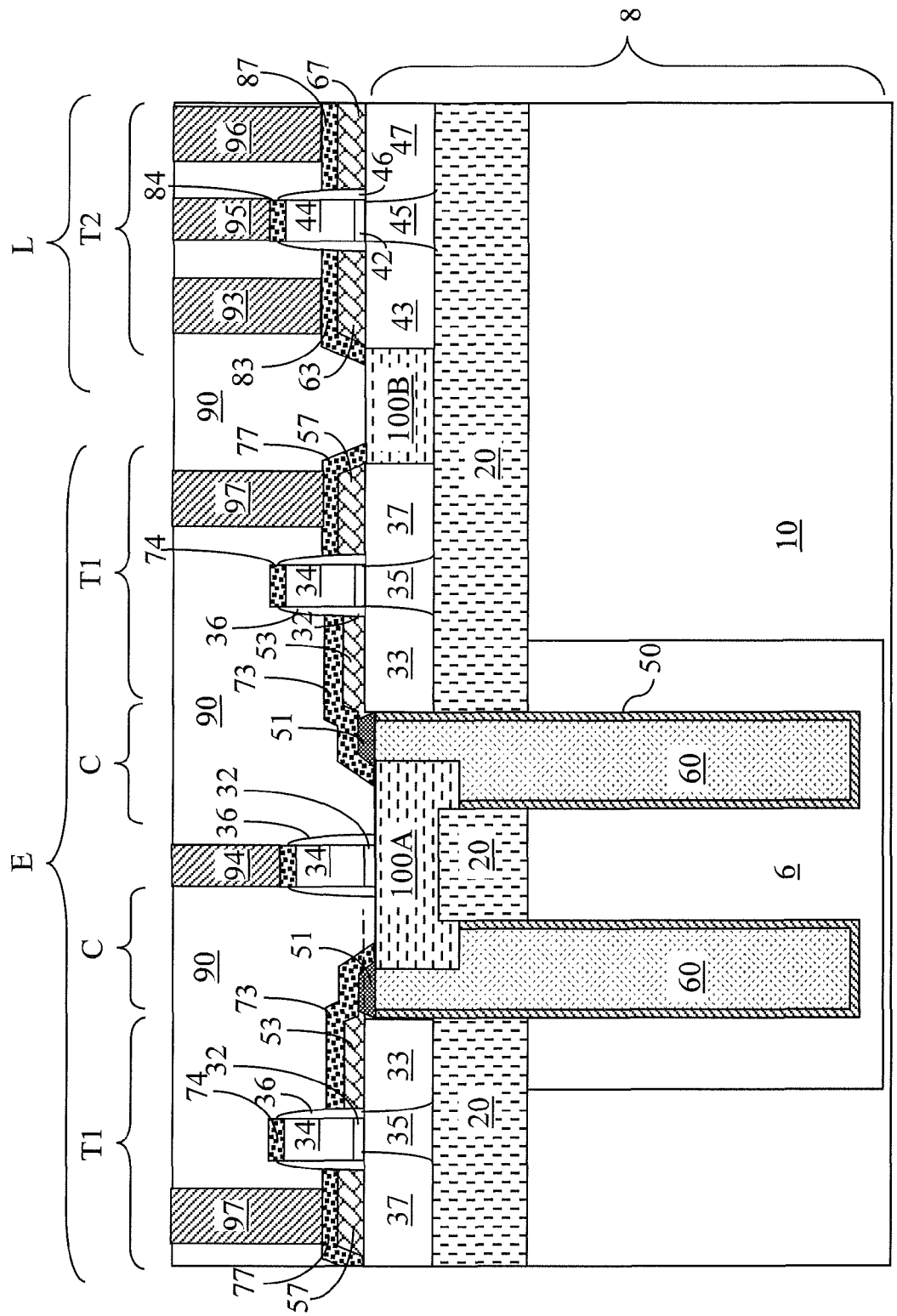
FIG. 12 is a vertical cross-sectional view of a fourth exemplary semiconductor structure according to a fourth embodiment of the present invention.

Referring to FIG. 12, a fourth exemplary semiconductor structure according to a fourth embodiment of the present invention can be derived from the first exemplary semiconductor structure by setting the recess depth r in FIG. 2 to be greater than the thickness of the pad layer 40. In this case, the interface between a raised strap region 51 and an underlying conductive trench fill region 60 is vertically offset so that the interface is located at a lower level than the interface between a first raised source region 53 and an underlying first planar source region 33. In this case, the node dielectric 50 can extend from a bottom surface of the deep trench up to the interface between the raised strap region 51 and the conductive trench fill region 60. A portion of each source-side metal semiconductor alloy portion 51, i.e., the portion below a dotted line, is located below the topmost surface of the top semiconductor layer, which includes the first planar source regions 33, the first body regions 35, and the first planar drain regions 37.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a deep trench in a semiconductor-on-insulator (SOI) substrate;
   forming a node dielectric directly on sidewalls of said deep trench;
   forming a conductive trench fill region on said node dielectric and completely filling said deep trench, wherein an active region in a top semiconductor layer of said SOI substrate does not contact said conductive trench fill region, and said active region is laterally spaced from said conductive trench fill region by said node dielectric;
   recessing said conductive trench fill region and said node dielectric within said deep trench, wherein a topmost surface of said node dielectric and a topmost surface of said conductive trench fill region are located above a topmost surface of a buried insulator layer after said recessing; and
   depositing a semiconductor material by selective epitaxy on an exposed surface of said active region and an exposed surface of said conductive trench fill region, wherein a raised source region is formed directly on said exposed surface of said active region and a raised strap region is formed directly on said exposed surface of said conductive trench fill region, and said raised source region contacts said raised strap region.

2. The method of claim 1, wherein forming the deep trench comprises reactive ion etch (RIE).

3. The method of claim 1, wherein a depth of the deep trench as measured from a top surface of the SOI substrate ranges from 0.8 mm to 20 μm.

4. The method of claim 1 further comprising forming at least one buried plate outside the sidewalls of the deep trench.

5. The method of claim 1, wherein the node dielectric is selected from the group consisting of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

6. The method of claim 1, wherein the conductive fill region is deposited by low pressure chemical vapor deposition (LPCVD).

7. The method of claim 1, wherein a conductive fill material of the conductive fill region is selected from the group consisting of germanium, a silicon germanium alloy, metal, a metallic compound, conductive carbon and a combination thereof.

8. The method of claim 1, wherein a conductive fill material of the conductive fill region is selected from the group consisting of Ti, Co, Ni, Ta, W, Pt, Pd and an alloy thereof.

9. The method of claim 1, further comprising forming a shallow trench isolation structure, wherein a topmost surface of said conductive trench fill region does not underlie said shallow trench isolation structure, and constitutes said exposed surface of said conductive trench fill region.

10. The method of claim 1, further comprising:
    forming a gate stack including a gate dielectric and a gate conductor on said active region; and
    forming a planar source region in said active region by implanting dopants into said active region employing said gate stack as a mask.

11. The method of claim 1, wherein said raised source region is deposited as a single crystalline doped semiconductor region during said selective epitaxy, and said raised strap region is deposited as a polycrystalline doped semiconductor region during said selective epitaxy.

12. The method of claim 1, wherein said raised source region is deposited as a single crystalline undoped semiconductor region during said selective epitaxy, said raised strap region is deposited as a polycrystalline undoped semiconductor region during said selective epitaxy, and said planar source region is formed after said selective epitaxy.

13. The method of claim 12, wherein dopants are introduced to the raised source region by ion implantation.

14. The method of claim 13 further comprising annealing in an inert gas atmosphere at a temperature ranging from 100° C. to 600° C.

* * * * *